(12) United States Patent
Hanson et al.

(10) Patent No.: US 6,368,475 B1
(45) Date of Patent: Apr. 9, 2002

(54) APPARATUS FOR ELECTROCHEMICALLY PROCESSING A MICROELECTRONIC WORKPIECE

(75) Inventors: Kyle M. Hanson; Scott Grace; Matt Johnson; Ken Gibbons, all of Kalispell, MT (US)

(73) Assignee: Semitool, Inc., Kalispell, MT (US)

( * ) Notice: Subject to any disclaimer, the term of this patent is extended or adjusted under 35 U.S.C. 154(b) by 0 days.

(21) Appl. No.: 09/531,828

(22) Filed: Mar. 21, 2000

(51) Int. Cl.[7] .............................. C25B 9/00; C25C 7/00; C25D 17/00
(52) U.S. Cl. ..................... 204/275.1; 204/263; 204/252
(58) Field of Search ................................. 204/252, 259, 204/297.11, 263, 275.1, 238; 205/123, 157, 148, 68

(56) References Cited

U.S. PATENT DOCUMENTS

| 4,391,694 A | 7/1983 | Runsten |
| 5,904,827 A | * 5/1999 | Reynolds .................. 205/68 |
| 6,126,798 A | * 10/2000 | Reid et al. ................ 204/282 |

* cited by examiner

Primary Examiner—Kathryn Gorgos
Assistant Examiner—Wesley A. Nicolas
(74) Attorney, Agent, or Firm—Perkins Coie LLP (57) ABSTRACT

A reactor for use in electrochemical processing of a microelectronic workpiece is set forth and described herein. The apparatus comprises one or more walls defining a processing space therebetween for containing a processing fluid. The processing space includes at least a first fluid flow region and a second fluid flow region. A first electrode is disposed in the processing fluid of the first fluid flow region while a second electrode, comprising at least a portion of the microelectronic workpiece, is disposed in the processing fluid of the second fluid flow region. Fluid flow within the first fluid flow region is generally directed toward the first electrode and away from the second electrode while fluid flow within the second fluid flow region is generally directed toward the second electrode and away from the first electrode. Depending on the particular electrochemical process that is to be executed, the first electrode may constitute either an anode or a cathode in the electrochemical processing of the microelectronic workpiece.

33 Claims, 4 Drawing Sheets

APPARATUS FOR ELECTROCHEMICALLY PROCESSING A MICROELECTRONIC WORKPIECE

CROSS-REFERENCE TO RELATED APPLICATIONS

Not Applicable.

STATEMENT REGARDING FEDERALLY SPONSORED RESEARCH OR DEVELOPMENT

Not Applicable.

BACKGROUND OF THE INVENTION

The present invention is directed to an apparatus for electrochemically processing a microelectronic workpiece. More particularly, the present invention is directed to a reactor assembly for electrochemically depositing, electrochemically removing and/or electrochemically altering the characteristics of a thin film material, such as a metal or dielectric, at the surface of a microelectronic workpiece, such as a semiconductor wafer. For purposes of the present application, a microelectronic workpiece is defined to include a workpiece formed from a substrate upon which microelectronic circuits or components, data storage elements or layers, and/or micro-mechanical elements are formed.

Production of semiconductor integrated circuits and other microelectronic devices from workpieces, such as semiconductor wafers, typically requires formation and/or electrochemical processing of one or more thin film layers on the wafer. These thin film layers are often in the form of a deposited metal that is used, for example, to electrically interconnect the various devices of the integrated circuit. Further, the structures formed from the metal layers may constitute microelectronic devices such as read/write heads, etc.

The microelectronic manufacturing industry has applied a wide range of thin film layer materials to form such microelectronic structures. These thin film materials include metals and metal alloys such as, for example, nickel, tungsten, tantalum, solder, platinum, copper, copper-zinc, etc., as well as dielectric materials, such as metal oxides, semiconductor oxides, and perovskite materials.

A wide range of processing techniques have been used to deposit and/or alter the characteristics of such thin film layers. These techniques include, for example, chemical vapor deposition (CVD), physical vapor deposition (PVD), anodizing, electroplating, and electroless plating. Of these techniques, electrochemical processing techniques (i.e., electroplating, anodizing, and electroless plating) tend to be the most economical and, as such, the most desirable. Such electrochemical processing techniques can be used in the deposition and/or alteration of blanket metal layers, blanket dielectric layers, patterned metal layers, and patterned dielectric layers.

One of the process sequences used in the microelectronic manufacturing industry to deposit a metal onto semiconductor wafers is referred to as "damascene" processing. In such processing, holes, commonly called "vias", trenches and/or other micro-recesses are formed onto a workpiece and filled with a metal, such as copper and/or a copper alloy. In the damascene process, the wafer is first provided with a metallic seed layer which is used to conduct electrical current during a subsequent metal electroplating step. If a metal such as copper is used, the seed layer is disposed over a barrier layer material, such as Ti, TiN, etc. The seed layer is a very thin layer of metal, such as copper, gold, nickel, palladium, etc., which can be applied using one or more of several processes. The seed layer is formed over the surface of the semiconductor wafer, which is convoluted by the presence of the vias, trenches, or other recessed device features.

A metal layer is then electroplated onto the seed layer in the form of a blanket layer. The blanket layer is plated to form an overlying layer, with the goal of providing a metal layer that fills the trenches and vias and extends a certain amount above these features. Such a blanket layer will typically have a thickness on the order of 10,000 to 15,000 angstroms (1–1.5 microns).

After the blanket layer has been electroplated onto the semiconductor wafer, excess metal material present outside of the vias, trenches, or other recesses is removed. The metal is removed to provide a resulting pattern of metal layer in the semiconductor integrated circuit being formed. The excess plated material can be removed, for example, using chemical mechanical planarization. Chemical mechanical planarization is a processing step which uses the combined action of a chemical removal agent and an abrasive which grinds and polishes the exposed metal surface to remove undesired parts of the metal layer applied in the electroplating step.

The electroplating of the semiconductor wafers takes place in a reactor assembly. In such an assembly, an anode electrode is disposed in a plating bath, and the wafer with the seed layer thereon is used as a cathode. Only a lower face of the wafer contacts the surface of the plating bath. The wafer is held by a support system that also conducts the requisite electroplating power (e.g., cathode current) to the wafer.

Several technical problems must be overcome in designing reactors used in the electrochemical processing of microelectronic workpieces, such as semiconductor wafers. One such problem relates to the formation of particulates contamination, gas bubbles, etc., that form at the surface of the anode (or, in the case of anodization, both the cathode and anode) during the electrochemical process. Although such problems exist in connection with the wide range of electrochemical processes, the discussion below focuses on those problems associated with electroplating a metal onto the surface of the microelectronic workpiece.

Generally stated, electroplating occurs as a result of an electrochemical reduction reaction that takes place at the cathode, where atoms of the material to be plated are deposited onto the cathode by supplying electrons to attract positively charged ions. The atoms are formed from ions present in the plating bath. In order to sustain the reaction, the ions in the plating bath must be replenished. Replenishment is generally accomplished through the use of a consumable anode or through the use of an external chemical source, such as a bath additive, containing the ions or an ion-forming compound.

As the thin film layer is deposited onto the cathode, a corresponding electrochemical oxidation reaction takes place at the anode. During this corresponding electrochemical reaction, byproducts from the electrochemical reaction, such as particulates, precipitates, gas bubbles, etc., may be formed at the surface of the anode. Such byproducts may then be released into the processing bath and interfere with the proper formation of the thin-film layer at the surface of the microelectronic workpiece. Furthermore if these byproducts are allowed to remain present in the processing fluid at elevated levels near the anode, they can affect current flow during the plating process and/or affect further reactions that must take place at the anode if the electroplating is to continue. For example, if copper concentrations are allowed to increase excessively, copper sulfate will precipitate due to the common ion effect. In order to reduce and or eliminate this problem, electrolyte flow near the anode is maintained at a sufficient level to allow mixing of the dissolved species in the electrolyte.

Such byproducts can be particularly problematic in those instances in which the anode is consumable. For example, when copper is electroplated onto a workpiece using a consumable phosphorized copper anode, a black anode film is produced. The presence and consistency of the black film is important to ensure uniform anode erosion. This oxide/salt film is fragile, however. As such, it is possible to dislodge particulates from this black film into the electroplating solution. These particulates can then potentially be incorporated into the deposited film with the undesired consequences.

One technique for limiting the introduction of particulates and/or precipitates produced at the anode into the plating bath, has been to enclose the anode in an anode bag. The anode bag is typically made of a porous material, which generally traps larger size particulates within the anode bag, while allowing smaller size particulates to be released external to the bag and into the plating bath. As the features of the structures and devices formed on the microelectronic workpiece decrease in size, however, the performance of the structures and devices may be degraded by even the smaller size particulates. Furthermore, while the use of an anode bag will restrict the larger particulates from traveling toward the cathode and contaminating the plating surface or affecting the plating process taking place at the cathode, the anode bag will also trap the larger particulates within the proximity of the anode creating elevated levels of these byproducts, which may limit the forward electrochemical reaction taking place at the anode. Still further, the larger particulates can eventually block the porous nature of the anode bag and ultimately restrict even the regular fluid flow.

The present inventors have recognized the foregoing problems and have developed a method and apparatus that assists in isolating byproducts that form at an electrode of an electrochemical processing apparatus to prevent them from interfering with the uniform electrochemical processing of the workpiece.

BRIEF SUMMARY OF THE INVENTION

A reactor for use in electrochemical processing of a microelectronic workpiece is set forth and described herein. The apparatus comprises one or more walls defining a processing space therebetween for containing a processing fluid. The processing space includes at least a first fluid flow region and a second fluid flow region. A first electrode is disposed in the processing fluid of the first fluid flow region while a second electrode, comprising at least a portion of the microelectronic workpiece, is disposed in the processing fluid of the second fluid flow region. Fluid flow within the first fluid flow region is generally directed toward the first electrode and away from the second electrode while fluid flow within the second fluid flow region is generally directed toward the second electrode and away from the first electrode. Depending on the particular electrochemical process that is to be executed, the first electrode may constitute either an anode or a cathode in the electrochemical processing of the microelectronic workpiece. The foregoing reactor architecture is particularly useful in connection with electroplating of the microelectronic workpiece and, more particularly, in electroplating operations that employ a consumable anode, such as a phosphorized copper anode.

In accordance with one embodiment of the invention, the reactor comprises at least one pressure drop member disposed in the processing fluid of the processing space in an intermediate position between the first and second fluid flow regions and the first and second fluid flow regions are adjacent one another.

The pressure drop member may comprise a permeable membrane that is disposed over an open end of a cup assembly wherein the membrane is permeable to at least one of the ionic species in the processing fluid. The cup assembly may comprise an electrode housing assembly having an inverted u-shaped lip, and an outer cup assembly. In accordance with a further enhancement of this embodiment, the cup assembly further includes at least one outlet tube having an opening, which extends into the space within the inverted u-shaped lip of the electrode housing assembly. The outlet tube provides a path for processing fluid, gas bubbles, and particulates to exit the cup assembly, while the pressure drop member restricts movement of the same into the second fluid flow region of the cup assembly.

A method for processing a microelectronic workpiece is also set forth. In accordance with one embodiment of the method, a processing space containing processing fluid is divided into at least a first fluid flow region and a second fluid flow region. A first electrode is located within the processing fluid of the first fluid flow region and a second electrode comprising at least a portion of the microelectronic workpiece is located within the processing fluid of the second fluid flow region. A fluid flow of the processing fluid is generated within the first fluid flow region that is generally directed toward the first electrode and generally away from the second electrode while a fluid flow of the processing fluid within the second fluid flow region is generated that is generally directed toward the second electrode and generally away from the first electrode.

DETAILED DESCRIPTION OF THE INVENTION

Figure 1:
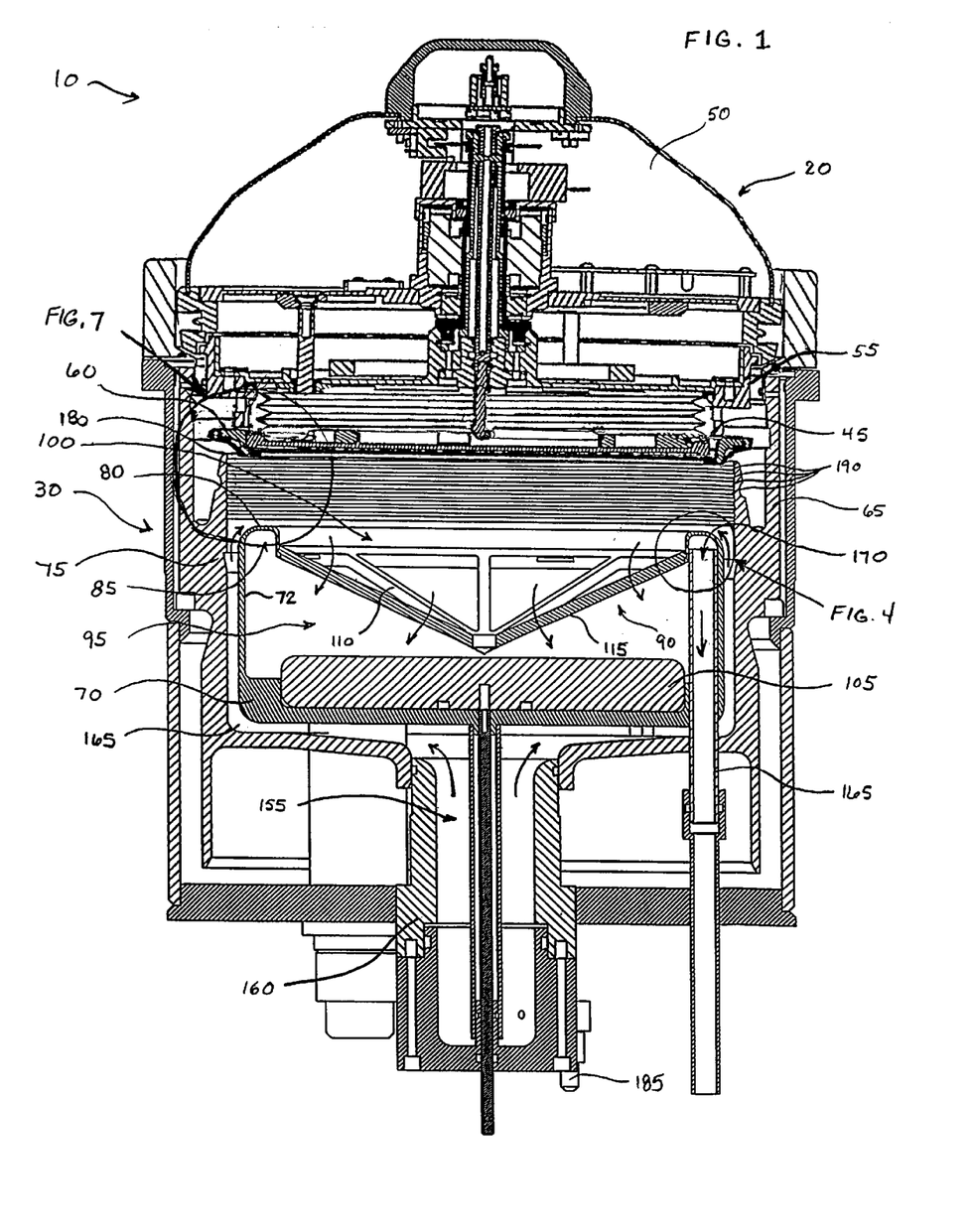
FIG. 1 illustrates a cross sectional side view of a plating reactor in accordance with the present invention.

FIG. 1 illustrates a cross-sectional side view of a reactor, shown generally at 10, for electrochemical processing of a microelectronic workpiece in accordance with one embodiment the present invention. In the particular embodiment of the invention shown here, the reactor is adapted for electrochemical deposition of a metal, such as copper or copper alloy, on the surface of the microelectronic workpiece. Accordingly, the following description includes express references to elements used in such electrochemical deposition processes. It will be recognized, however, that the reactor architecture is suitable for a wide range of electrochemical processing operations including, for example, anodization of a surface of the workpiece.

The reactor 10 has a reactor head assembly 20 that assists in supporting the workpiece during processing, and a corresponding processing space in the form of a reactor bowl assembly 30. Reactor bowl assembly 30 includes one or more walls that define a processing space that contains a processing fluid, as will be set forth in further detail below. This type of reactor assembly is particularly suited for effecting electroplating of semiconductor wafers or like workpieces, in which the wafer is electroplated with a blanket or patterned metallic layer.

The reactor head assembly 20 and the reactor bowl assembly 30 of the illustrated embodiment may be moved relative to one another. For example, a lift and rotate mechanism, not shown, may be used in conjunction with the head and bowl assemblies 20, 30 to drive the reactor head 20 in a vertical direction with respect to the reactor bowl assembly 30 and to rotate the reactor head assembly 20 about a horizontally disposed axis. By lifting and rotating the reactor head assembly 20, a workpiece 45, such as a semiconductor wafer, may be moved between a load position that allows the workpiece 45 to be placed upon the head assembly 20, and a processing position in which at least a portion of the workpiece 45 is brought into contact with processing fluid in the processing space of the reactor bowl assembly 30. When the workpiece is in the processing position, it is generally oriented with the process side down within the processing space. When the workpiece 45 is in the load position, the workpiece 45 is generally exposed outside of the reactor bowl assembly 30 with the process side directed upward, for loading and unloading by, for example, a robotic wafer transfer mechanism. One example of a suitable lift and rotate mechanism is described in connection with U.S. patent application Ser. No. 09/351,980, filed Jul. 12, 1999, now U.S. Pat. No. 6,168,695, entitled "Lift and Rotate Mechanism for Use in a Workpiece Processing Apparatus", the disclosure of which is incorporated herein by reference.

Preferably, the reactor head assembly 20 includes a stationary assembly 50 and a rotor assembly 55. The rotor assembly 55 is configured with one or more structures that serve to support the workpiece and to rotate the workpiece 45 about a generally vertical axis during, for example, workpiece processing.

In the reactor embodiment of FIG. 1, the workpiece 45 is held in place, with respect to the rotor assembly 55 by contact assembly 60. In addition to holding the workpiece 45 in place, the contact assembly 60 may include one or more electrical contacts that are disposed to engage the workpiece 45 for applying electrical power used in the electrochemical processing operation. One embodiment of a contact assembly is described in detail in connection with U.S. patent application Ser. No. 09/386,803, filed Aug. 31, 1999, entitled "Method and Apparatus for Processing the Surface of a Microelectronic Workpiece", the disclosure of which is incorporated herein by reference. It will be recognized, however, that other contact architectures, such as discrete finger contacts or the like, are also suitable depending on the desired electrochemical processing that is to take place in the reactor 10. One J-hook design described in connection with U.S. patent application Ser. No. 08/680,057, filed Jul. 15, 1996, now U.S. Pat No. 5,980,706, entitled "Electrode Semiconductor Workpiece Holder", the disclosure of which is similarly incorporated herein by reference.

During processing, the workpiece 45 is brought into contact with processing fluid located within the reactor bowl assembly 30. In the illustrated embodiment, reactor bowl assembly 30 comprises a reactor base assembly 65 that, in turn, includes process cup assembly 75 and an electrode housing assembly 70. The process cup assembly 75 includes a plurality of wall structures that define a processing space therebetween. The electrode housing assembly 70 is located within the process cup assembly 75 and includes therein an electrode 105 used in electrochemical processing of a workpiece 45.

Generally stated, the processing space within the process cup assembly 75 includes at least two process fluid flow regions. The first fluid flow region is proximate the upper end and interior to the electrode housing assembly 70 while the second flow region includes the region at the upper end of processing cup 75 proximate workpiece 45. As will be explained in further detail below, processing fluid flow in the first fluid flow region is generally directed toward the interior of the electrode housing assembly 70 and, more particularly, toward a surface of the electrode 105, and generally away from the workpiece 45. In contrast, the flow of processing fluid in the second fluid flow region is generally directed toward the workpiece 45 and generally away from electrode 105. One arrangement of structures that can be used to accomplish this fluid flow pattern is described in detail below.

The electrode housing assembly 70 of the illustrated embodiment includes a housing member 72, which is generally bowl shaped and includes an end that is open toward the workpiece 45. A pressure drop member 90 is disposed over the open end of the housing member 72. The pressure drop member 90 assists in dividing the processing space into the aforementioned first fluid flow region 95 and second fluid flow region 100.

The housing member 72 may have a lip 80 located at the opening or the rim thereof that extends radially inwards and then downward toward the base of the assembly. The lip 80 may have a cross section in the shape of an inverted "u" that defines a space 85 located therein, which extends around the circumference of the electrode housing assembly 70. The lip 80 may serve as the locus of the engagement between the housing member 72 and the pressure drop member 90. Together, the housing member 72 and pressure drop member 90 define an interior electrode chamber in which electrode 105 is disposed.

The pressure drop member 90 may be conically shaped, and have an apex oriented so as to extend downward into the interior electrode chamber. To this end, the pressure drop member 90 may comprise a conically shaped frame 110, and a permeable membrane 115 that is fixed with the surface of the conically shaped frame 110. The conically shaped frame 110 is particularly illustrated in FIG. 2 while the conically shaped frame 110 with the membrane 115 fixed thereto is particularly illustrated in FIG. 3. The membrane 115 may be fluid permeable or only permeable to at least one of the ionic species in the processing fluid. In this latter instance, the reactor may be augmented with separate inlets and outlets respectively associated with each of the fluid flow regions.

Figure 2:
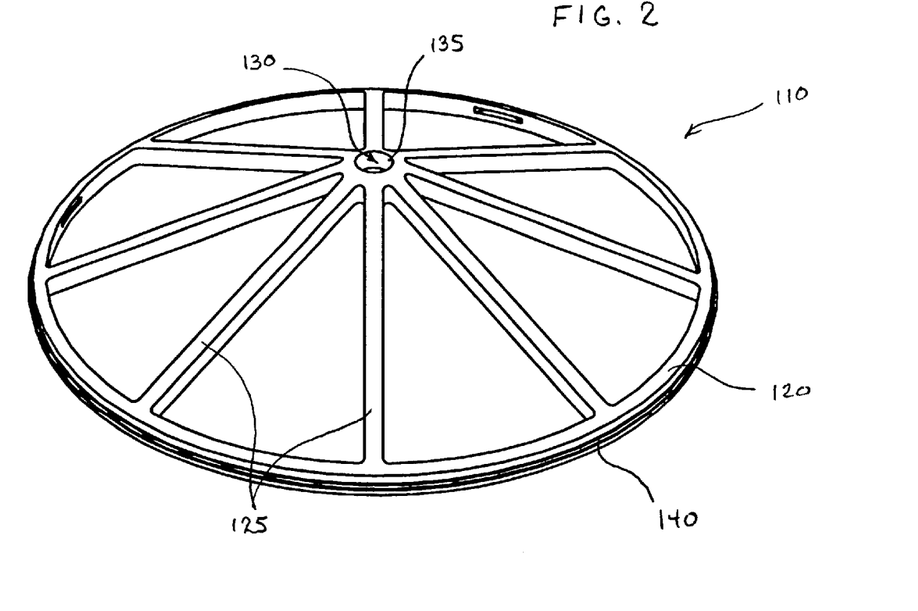
FIG. 2 illustrates an isometric view of a conically shaped frame of a pressure drop member for use in the plating reactor illustrated in FIG. 1.

FIG. 2 is an isometric view of the conically shaped frame 110 of the pressure drop member 90. The conically shaped frame 110 includes a continuous circular base member 120, and a plurality of ribs 125 which extend between the circular base member 120 and the point 130 of the conical shape. In the frame 110 at the place where the point 130 of the conical shape would be located, the conically shaped frame 110 includes a circular opening 135. The opening 135 in the frames avoids a large area near the point 130 of the conical shape, which might otherwise trap fluid and/or substantially restrict fluid or current flow.

Figure 4:
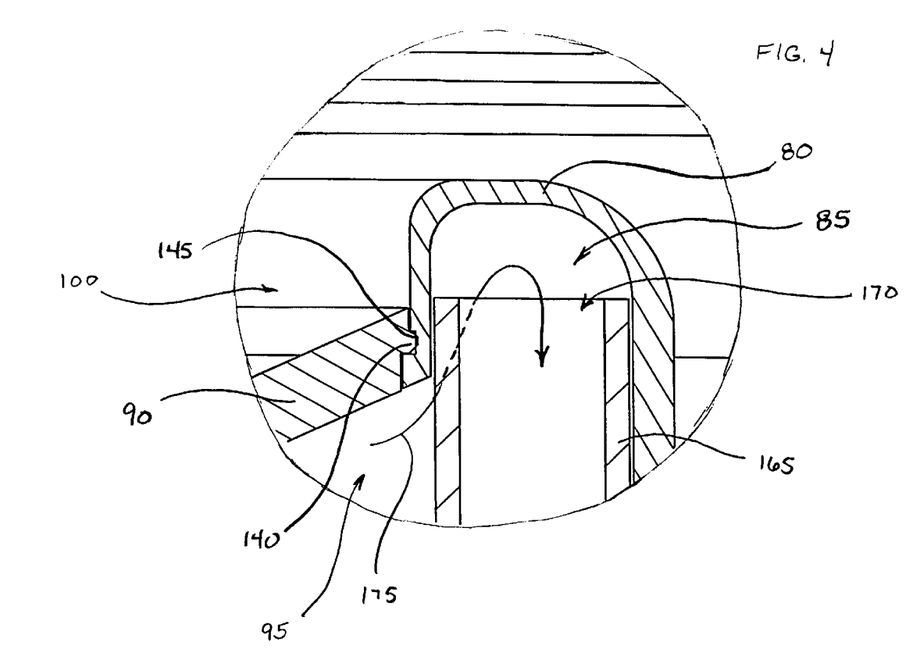
FIG. 4 illustrates an enlarged cross-sectional view of a portion of the plating reactor illustrated in FIG. 1.

Located around the circumference of the circular base member 120 of the conically shaped frame 110 is a protrusion 140, which extends outward from the circular base member 120 and is adapted for engaging a groove 145 located in the inverted un-shaped lip 80 of the electrode housing assembly 70 (shown more clearly in FIG. 4).

Figure 3:
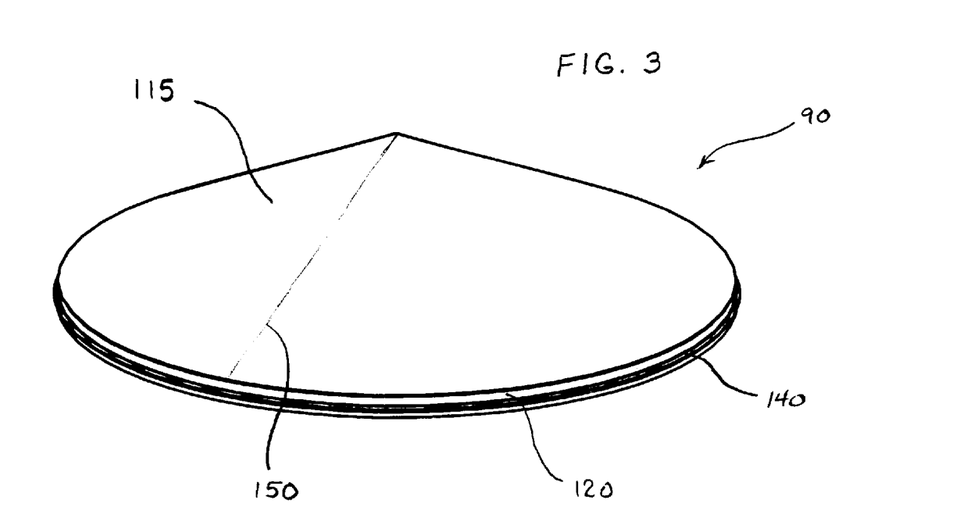
FIG. 3 illustrates an isometric view of the pressure drop member including the conically shaped frame, illustrated in FIG. 2, and a membrane attached thereto.

FIG. 3 is an isometric view of the pressure drop member 90, including the conically shaped frame 110 illustrated in FIG. 2, with the membrane 115 attached thereto. The membrane 115 may be comprised of a plastic filter type media, or other media that at least partially restricts the flow of processing fluid flow therethrough. The membrane 115 also assists in preventing larger size particulates, precipitates, and/or gas bubbles from crossing the pressure drop member 90 and entering the second fluid flow region.

The membrane 115 is preferably formed into a conical shape, by cutting a triangular pie-shaped notch in the membrane material. The resulting edges formed by the triangular shaped notch may then be joined and held together with, for example, a single ultrasonic weld seam 150. The membrane 115 is then attached to the conical shaped frame 110 using a similar ultrasonic weld along the ribs 125 and the continuous perimeter of the circular base member 120.

The circular base member 120, ribs 125 and membrane 115 are preferably formed from polypropylene, polyethylene, polyvinylidene fluoride, or other fluorocarbon type plastic. Such plastics are generally chemically inert with respect to the processing which is likely to take place in the plating reactor 10.

In an alternative embodiment, the pressure drop membrane is formed from a sufficiently resilient membrane which does not require an underlying frame structure.

Further alternative embodiments include the pressure drop member being formed from a pressed disk of porous ceramic or porous glass.

Referring back to FIG. 1, the plating reactor 10 further includes a fluid inlet 155 located within a riser tube 160 near the bottom of the cup assembly 65 for receiving processing fluid. The processing fluid is generally received from a fluid reservoir located external to the plating reactor 10.

The processing fluid received via the fluid inlet 155 initially enters the second fluid flow region 100 of the cup assembly 65 via the space 165 formed between the electrode housing assembly 70 and the process cup assembly 75. The processing fluid generally follows a flow corresponding to the direction of arrows illustrated in FIG. 1. While in the second fluid flow region 100, the processing fluid comes into contact with the workpiece 45 when in a processing position.

By placing the anode 105 in the first fluid flow region 95 within the electrode housing assembly 70 and having the processing fluid enter the cup assembly 65 via the second fluid flow region 100, the anode 105 is isolated from the fluid flow when the processing fluid initially enters the cup assembly 65. Correspondingly, the processing fluid does not directly impinge upon the anode 105, which may be a consumable anode. As a result the useful life of the anode 105 is prolonged.

In connection with the electrode housing assembly 70, the plating reactor includes a fluid outlet tube 165. The fluid outlet tube 165 has an opening 170, which extends into the space 85 formed within the inverted un-shaped lip 80 of the electrode housing assembly 70. The addition of processing fluid into second fluid flow region 100 via the fluid inlet 155 and the exit of fluid from the first fluid flow region 95 via the opening 170 in the fluid outlet tube 165, creates a pressure differential between the first fluid flow region 95 and the second fluid flow region 100 in which the pressure in the first fluid flow region 95 is lower than the pressure in the second fluid flow region 100. In the upper region of the reactor, fluid will flow from the second fluid flow region 100 into the first fluid flow region 95 through the pressure drop member 90 in an attempt to equalize pressure between the regions.

The pressure drop member 90 provides some resistance to the flow of fluid across the semi-porous membrane 115. As such, the pressure equalizing flow of processing fluid is somewhat restricted. Restricting the flow of fluid across the pressure drop member 90 has several effects. For example, the flow of process fluid across the pressure drop member 90 is distributed more evenly along the surface of the pressure drop member 90. Further, the restricted flow facilitates generation of a pressure differential between the first fluid flow region 95 and the second fluid flow region 100. Because the pressure in the second fluid flow region 100 is maintained at a level that is slightly higher than the pressure in the first region, fluid flow from the first fluid flow region 95 into the second fluid flow region 100 across the pressure drop member 90 is unlikely. This pressure differential, in turn, effectively restricts passage of any byproducts formed at electrode 105 during the electrochemical reaction to an area within the first fluid flow region 95 and assists in preventing such byproducts from reaching the surface of the workpiece 45. Rather, the byproducts generated within fluid flow region 95 can be directed from the processing space through the fluid outlet tube 165. Such an arrangement allows for separate processing of the processing fluid overflowing weir 180 and fluid exiting fluid outlet 165. Special filtering or processing of the processing fluid exiting the first fluid flow may be employed to particularly remove any of the unwanted byproducts before the processing fluid is mixed and/or processed with the processing fluid overflowing weir 180 for recirculation to the plating reactor 10 via the fluid inlet 155. As a result, exposure of the workpiece 45 to potentially harmful byproducts produced at the electrode 105 is substantially limited and/or can more easily be controlled using the illustrated reactor architecture.

Since the pressure drop member 90 is conically shaped and extends downward into the electrode housing assembly 70, it has a surface at the interior electrode chamber that is oriented at an angle. The angle at which the surface of the pressure drop member is defined so that the highest point of the pressure drop member 90 is proximate to the u-shaped lip 80 of the electrode housing assembly 70. The angled surface of the pressure drop member directs any particulates, precipitates or gas bubbles formed at the electrode 105 away from the center of the electrode housing assembly toward the periphery and into the space 85 within the u-shaped lip 80 of the electrode housing assembly 70. Not only does the angled surface of the pressure drop member move the byproducts away from the center of the processing area where they can otherwise adversely affect uniform current flow, the pressure drop member also assists in driving the byproducts toward the opening 170 of the fluid outlet tube 165. Eventually the particulates, precipitates and/or gas bubbles exit the cup assembly 65 along with the processing fluid via fluid outlet tube 165. This is more clearly shown in connection with FIG. 4.

FIG. 4 illustrates an enlarged cross-sectional view of an upper portion of the electrode housing assembly 70 of FIG. 1. More particularly, it illustrates the portion of the reactor bowl assembly 30 at which the pressure drop member 90 engages the u-shaped lip 80 of the electrode housing assembly 70, and also illustrates the fluid outlet tube 165 and the opening 170 that facilitates fluid communication with the space 85 defined by the un-shaped lip 80. One example of the potential direction of fluid flow exiting the first region 95 via the fluid outlet tube 165 is illustrated by arrow 175.

Specifically, the fluid pressure at the opening 170 and inside the fluid outlet tube 165 is lower than the fluid pressure located elsewhere in the cup assembly 65. This is due in part to the opening 170 of the fluid outlet tube 165 being below the overall level of the processing fluid. As a result of the lower pressure proximate the opening 170 of the fluid outlet tube 165, fluid will migrate towards the opening 165 from elsewhere in the cup assembly. More specifically, the fluid from the first region will generally migrate towards the space 85 within the U-shaped lip 80, which extends circumferentially around the outer perimeter of the cup assembly 65, proximate the opening 170. The fluid then enters the tube 165 via the opening 170 and exits the reactor bowl assembly 30.

Although the fluid flow from the first fluid flow region 95 to the second fluid flow region 100 is restricted, charged particles required for electrochemical processing of the workpiece 45 can still flow from the first fluid flow region 95 to the second fluid flow region 100 across the pressure drop member 90, as charged particles will flow independent of the fluid flow. This is possible if the particles are suitably charged and are sized appropriately to make it through the pressure drop barrier.

In addition to fluid outlet tube 165, the processing fluid can further exit the cup assembly 65 via an overflow weir 180 located at the lip of the wall of the process cup assembly 75. The processing fluid, which has overflowed the overflow weir 180, can then be drained via a cup drain valve 185 located near the bottom of the reactor bowl assembly 30.

In the embodiment illustrated in FIG. 1, the reactor bowl assembly 30 further provides for one or more mounting connections adapted for receiving one or more field shaping elements at the internal surface thereof near the lip of the wall of the process cup assembly 75. More specifically, in the preferred embodiment the mounting connections include one or more generally horizontal grooves 190 extending around the circumference of the wall at different elevations.

Field shaping elements provide for fluid and/or current shaping or tailoring. The field shaping elements mounted in one of the lower generally horizontal grooves 190 further from the workpiece 45 provides for more global shaping or tailoring of the flow of processing fluid and current, while field shaping elements mounted in one of the higher horizontal grooves 190 closer to the workpiece 45 provide for fluid and current shaping in connection with a more specific point on the workpiece 45.

In accordance with one embodiment used in the electroplating of copper onto the surface of the workpiece, a consumable phosphorized copper anode and two field shaping elements are used. The field shaping elements include a lower field shaping element 195 or diffuser plate (illustrated in FIG. 5) and an upper field shaping element 200 or shield (illustrated in FIG. 6).

Figure 5:
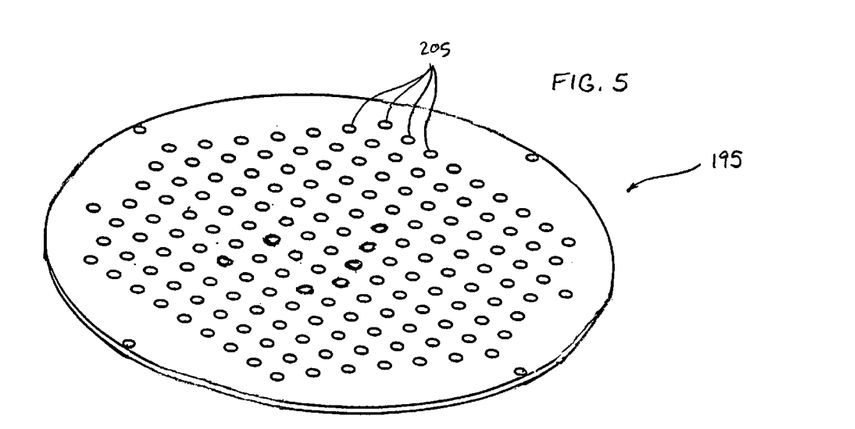
FIG. 5 illustrates an isometric view of one example of a field shaping element for use in the plating reactor illustrated in FIG. 1.
Figure 6:
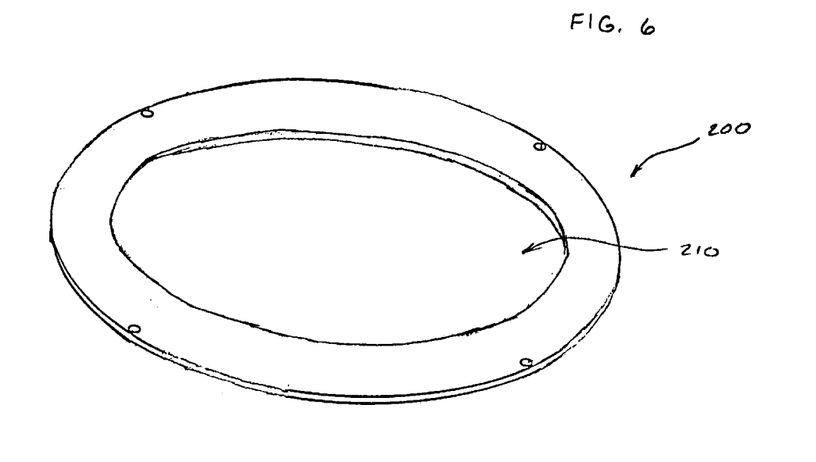
FIG. 6 illustrates an isometric view of another example of a field shaping element for use in the plating reactor illustrated in FIG. 1.

FIGS. 5 and 6 are isometric views of two embodiments of field shaping elements 195, 200 that may be used in the reactor 10. The field shaping elements 195, 200 generally each comprise a single plate of material having one or more openings through which plating fluid and/or current is enabled to flow. Depending on the opening pattern a more controlled distribution of plating fluid and current across the surface of the workpiece 45 can be achieved. Although each of these elements is illustrated to include peripherally disposed notches, such notches are optional but may be used to assist in securing the respective elements in place within the reactor assembly in cooperation with other corresponding structures.

FIG. 5 illustrates a first of the two preferred field shaping elements 195 that may be concurrently used in the reactor bowl assembly 30. The first field shaping element 195 includes a plurality of openings 205 arranged approximately in a grid like pattern. However, a spiral pattern may also be used. In at least one of the preferred embodiments, the first field shaping element 195 is positioned in one of the lower horizontal grooves 190.

FIG. 6 illustrates a second of the two preferred field shaping elements 200 that may be used along with the first field shaping element 195 illustrated in FIG. 5. The second field shaping element 200 preferably includes a single larger opening 210 approximately centered in the field shaping element 200. The second field shaping element 200 directs the processing fluid and electrical current away from the edge of the workpiece 45. In at least one embodiment, the second field shaping element 200 may be positioned proximate to the workpiece 45 in one of the higher horizontal grooves 190.

Examples of field shaping elements or diffuser plates, including diffuser plates having alternative opening patterns, are further described in connection with U.S. patent application Ser. No. 09/351,864, filed Jul. 12, 1999, entitled "Diffuser with Spiral Opening Pattern for Electroplating Reactor Vessel", the disclosure of which is incorporated herein by reference.

Figure 7:
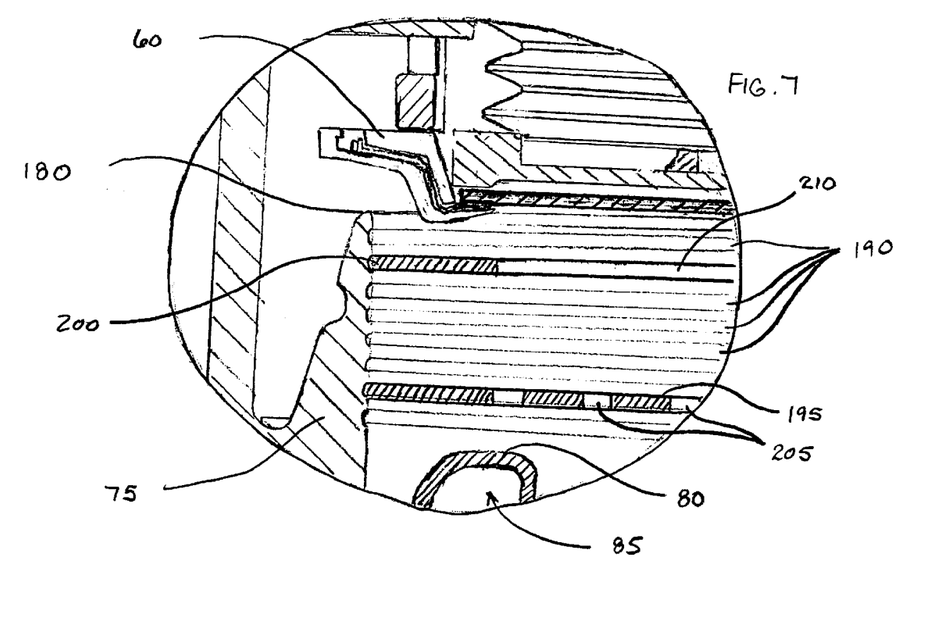
FIG. 7 illustrates an enlarged cross-sectional view of a portion of the plating reactor illustrated in FIG. 1, with the field shaping elements illustrated in FIGS. 5 and 6 similarly shown.

FIG. 7 illustrates an enlarged cross-sectional view of a portion of the plating reactor illustrated in FIG. 1, further illustrating one particular embodiment where the field shaping elements 195 and 200, illustrated in FIGS. 5 and 6, are each present in one of the plurality of horizontal grooves 190 for receiving a field shaping element. Specifically, FIG. 7 illustrates the field shaping element 200 or shield (illustrated in FIG. 6) in one of the higher horizontal grooves, and the field shaping element 195 or diffuser plate (illustrated in FIG. 5) in one of the lower horizontal grooves.

Use of the present invention in an electroplating process is not only envisioned with respect the plating of copper onto a workpiece using a consumable phosphorized anode, but is further envisioned as having utility in any electroplating process where there is a desire to limit exposure of the cathode/workpiece to the products produced at the anode. For example, the above noted electroplating process is further envisioned as having utility in connection with a process for plating nickel onto a workpiece using a consumable nickel sulfur anode, and a process for plating solder onto a workpiece using a consumable tin lead anode, or for anodic processing of a workpiece, in which gas is produced at the cathode.

Numerous modifications may be made to the foregoing system without departing from the basic teachings thereof. Although the present invention has been described in substantial detail with reference to one or more specific embodiments, those of skill in the art will recognize that changes may be made thereto without departing from the scope and spirit of the invention as set forth in the appended claims.

What is claimed is:

1. A reactor for use in electrochemical processing of a microelectronic workpiece, comprising:
   one or more walls defining a processing space therebetween for containing a processing fluid;
   a first fluid flow region in the processing space and a second fluid flow region in the processing space, the second fluid flow region being positioned to direct fluid into the first fluid flow region;
   a first electrode disposed in the first fluid flow region;
   a second electrode disposed in the second fluid region, the second electrode comprising at least a portion of the microelectronic workpiece, wherein the first fluid flow region is positioned to direct fluid generally toward the first electrode and away from the second electrode, and wherein the second fluid flow region is positioned to direct fluid toward the second electrode generally annularly inwardly from an outer portion of the second fluid flow region to an inner portion.

2. A reactor as claimed in claim 1 wherein the first electrode includes an anode configured to electrochemically process the microelectronic workpiece.

3. A reactor as claimed in claim 1 wherein the first electrode includes a cathode configured to electrochemically process the microelectronic workpiece.

4. A reactor as claimed in claim 1 wherein a single fluid inlet provides processing fluid to both the first and second fluid flow regions.

5. A reactor as claimed in claim 1 and further comprising at least one pressure drop member disposed in the processing space in an intermediate position between the first and second fluid flow regions.

6. A reactor as claimed in claim 1 wherein the first fluid flow region is adjacent the second fluid flow region.

7. A reactor as claimed in claim 5 wherein the first fluid flow region is adjacent the second fluid flow region.

8. A reactor for electrochemically processing a microelectronic workpiece, comprising:
   one or more walls defining a processing space therebetween for containing a processing fluid;
   a microelectronic workpiece support including one or more conductive members disposed to electrically contact the microelectronic workpiece to provide electrical power for electrochemical processing of the microelectronic workpiece, the microelectronic workpiece support being disposed to bring at least one portion of a microelectronic workpiece into contact with a processing fluid when the microelectronic workpiece support supports a microelectronic workpiece, and when the processing space contains the processing fluid;
   at least one electrode positioned to contact the processing fluid when the processing fluid is disposed in the processing space, the at least one electrode being spaced from the microelectronic workpiece when the microelectronic workpiece support supports the microelectronic workpiece, the at least one electrode being positioned to provide electrical power for electrochemical processing of the microelectronic workpiece;
   at least one processing fluid inlet disposed to provide a flow of the processing fluid into the processing space and annularly inwardly from an outer region of the processing space to an inner region of the processing space;
   at least one processing fluid outlet disposed to provide a flow of the processing fluid from the processing space, the at least one processing fluid outlet being positioned within the processing space to direct at least a portion of the flow of the processing fluid about the at least one electrode and away from the microelectronic workpiece as the flow exits from the processing space.

9. A reactor as claimed in claim 8 wherein the at least one electrode comprises an anode configured to electrochemically process the microelectronic workpiece.

10. A reactor as claimed in claim 8 wherein the at least one electrode comprises a cathode configured to electrochemically process of the microelectronic workpiece.

11. A reactor as claimed in claim 8 and further comprising at least one permeable membrane disposed between the microelectronic workpiece support and the at least one electrode.

12. A reactor as claimed in claim 11 wherein the at least one permeable membrane is disposed between a first fluid flow region of the processing space and a second fluid flow region of the processing space.

13. A reactor as claimed in claim 12 wherein the at least one processing fluid inlet is disposed in the second fluid flow region.

14. A reactor as claimed in claim 13 wherein the at least one processing fluid outlet is disposed in the first fluid flow region.

15. A reactor as claimed in claim 12 wherein the at least one processing fluid outlet is disposed in the first fluid flow region.

16. A reactor as claimed in claim 15 and further comprising a further processing fluid outlet disposed in the second fluid flow region proximate the microelectronic workpiece.

17. A reactor as claimed in claim 8 and further comprising a further processing fluid outlet disposed proximate the microelectronic workpiece.

18. A reactor as claimed in claim 12 wherein the first and second fluid flow regions are adjacent one another.

19. A reactor as claimed in claim 8 and further comprising:
   a cup disposed in the processing space, the cup including an open end that opens toward the microelectronic workpiece support;
   a pressure drop member disposed over the open end of the cup, the at least one electrode being disposed in an interior chamber defined by at least the cup and the pressure drop member.

20. A reactor as claimed in claim 19 wherein the pressure drop member comprises a permeable membrane having a conical shape with an apex directed toward the interior chamber.

21. A reactor as claimed in claim 19 wherein the at least one processing fluid outlet is disposed to exhaust processing fluid from the interior chamber.

22. A reactor as claimed in claim 8 wherein the one or more walls defining the processing space form a cup having an open upper end.

23. A reactor as claimed in claim 22 and further comprising a head assembly including the microelectronic workpiece support, the head assembly being movable with respect to the open upper end of the cup between a workpiece loading position and a workpiece processing position.

24. A reactor is claimed in claim 8 wherein the microelectronic workpiece support is rotatable to facilitate rotation of the microelectronic workpiece during electrochemical processing thereof.

25. A reactor is claimed in claim 23 wherein the head assembly comprises a rotor motor that is connected to the microelectronic workpiece support to rotate the microelectronic workpiece during electrochemical processing thereof.

26. An apparatus for electrochemically processing a microelectronic workpiece, comprising:

means for containing a processing fluid and forming a processing space;

means for providing electrical contact to one or more surfaces of the microelectronic workpiece to supply electrical power for electrochemical processing of the workpiece;

electrode means for supplying electrical power for electrochemical processing of the microelectronic workpiece; and means for providing a first fluid flow region and a second fluid flow region within the processing space, the electrode means being disposed in the first fluid flow region, the means for providing electrical contact being disposed in the second fluid flow region, processing fluid flow within the first fluid flow region being positioned to direct fluid generally toward the electrode means and generally away from the means for providing electrical contact; processing fluid flow within the second fluid flow region being positioned to direct fluid generally annularly inwardly from an outer portion of the second fluid flow region to an inner portion and toward one or more surfaces of a microelectronic workpiece contacted by the means for providing electrical contact.

27. An apparatus as claimed in claim 26 wherein the at least one electrode comprises an anode configured to electrochemically process of the microelectronic workpiece.

28. An apparatus as claimed in claim 26 wherein the at least one electrode comprises a cathode configured to electrochemically process of the microelectronic workpiece.

29. An apparatus for electrochemically processing a microelectronic workpiece, comprising:

at least one wall defining a processing space configured to receive a processing fluid, the processing space having a first fluid flow region and a second fluid flow region in fluid communication with the first fluid flow region, the first fluid flow region being positioned to receive processing fluid from the second fluid flow region; and an electrode support positioned in the first fluid flow region and configured to support an electrode in fluid communication with the first fluid flow region; wherein the second fluid flow region defines a deposition region configured to deposit material on a microelectronic workpiece when the microelectronic workpiece is in the second fluid flow region, the second fluid flow region having an outer portion and a central portion positioned annularly within the outer portion, the outer portion being positioned to receive the processing fluid and direct the processing fluid annularly inwardly to the central portion; and wherein the first fluid flow region has an exit positioned to receive the processing fluid and direct the processing fluid from the processing space.

30. The apparatus of claim 29, further comprising a permeable membrane positioned between the first and second fluid flow regions.

31. The apparatus of claim 29, further comprising a pressure drop member positioned between the first and second fluid flow regions.

32. The apparatus of claim 29, further comprising an anode carried by the electrode support.

33. The apparatus of claim 29, further comprising a microelectronic workpiece support positioned to carry the microelectronic workpiece in fluid communication with the second fluid flow region, the microelectronic workpiece support having a contact assembly positioned to provide electrical contact with the microelectronic workpiece.

* * * * *

UNITED STATES PATENT AND TRADEMARK OFFICE
CERTIFICATE OF CORRECTION

PATENT NO. : 6,368,475 B1
DATED : April 9, 2002
INVENTOR(S) : Hanson et al.

It is certified that error appears in the above-identified patent and that said Letters Patent is hereby corrected as shown below:

Title page,
Item [57], ABSTRACT,
Line 18, insert -- The foregoing reactor architecture is particularly useful in connection with electroplating of the microelectronic workpiece and, more particularly, in electroplating operations that employ a consumable anode, such as a phosphorized copper anode. -- after "workpiece."

Column 8,
Line 6, "un-shaped" should read -- u-shaped --;

Column 9,
Line 12, "un-shaped" should read -- u-shaped --;

Column 11,
Line 15, insert -- flow -- between "fluid" and "region";

Signed and Sealed this

Fourteenth Day of January, 2003

JAMES E. ROGAN
*Director of the United States Patent and Trademark Office*